(12) United States Patent
Wang et al.

(10) Patent No.: US 9,331,597 B2
(45) Date of Patent: *May 3, 2016

(54) LATCHING COMPARATOR

(71) Applicant: Power Integrations, Inc., San Jose, CA (US)

(72) Inventors: Zhao-Jun Wang, San Jose, CA (US); Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/858,740

(22) Filed: Sep. 18, 2015

(65) Prior Publication Data

US 2016/0013731 A1 Jan. 14, 2016

Related U.S. Application Data

(63) Continuation of application No. 13/399,741, filed on Feb. 17, 2012, now Pat. No. 9,154,119.

(51) Int. Cl.
*G05F 1/00* (2006.01)
*H02M 7/06* (2006.01)
*H03K 5/24* (2006.01)

(52) U.S. Cl.
CPC .. *H02M 7/06* (2013.01); *H03K 5/24* (2013.01)

(58) Field of Classification Search
CPC .................. H02M 1/08; H02M 3/156–3/158; H03K 5/24
USPC ........... 327/65, 67, 72, 77, 57, 202, 203, 205, 327/206, 208, 108; 323/282–290, 271; 363/17, 126
See application file for complete search history.

(56) References Cited

U.S. PATENT DOCUMENTS 6,252,434 B1 6/2001 Nag et al.
6,282,129 B1 8/2001 Khoury et al.
7,268,604 B2 9/2007 Koo
(Continued)

FOREIGN PATENT DOCUMENTS

CN 101465649 A 6/2009
CN 201341126 Y 11/2009

OTHER PUBLICATIONS

TW Application No. 102105238—Taiwanese Office Action and Search Report, issued Aug. 7, 2014, with Summary of Examiner's Opinions in Office Action (18 pages).

(Continued)

*Primary Examiner* — Timothy J Dole
*Assistant Examiner* — Shahzeb K Ahmad
(74) *Attorney, Agent, or Firm* — Blakely Sokoloff Taylor & Zafman LLP

(57) ABSTRACT

A latching comparator includes a switching logic circuit coupled to receive a first signal from a first signal circuit, and a second signal from a second signal circuit. The switching logic circuit is further coupled to receive a latching signal that is a rectangular pulse waveform in either a first or a second state. An output circuit having an input terminal is coupled to the switching logic circuit. The input terminal of the output circuit is coupled to receive both the first and second signals to compare the first signal and second signal when the latching signal is in the first state. The input terminal of the output circuit is coupled to receive only one of the first and second signals when the latching signal is in the second state.

16 Claims, 7 Drawing Sheets

(56) References Cited

U.S. PATENT DOCUMENTS

| | | |
|---|---|---|
| 7,532,041 B2 | 5/2009 | Blackall et al. |
| 7,646,221 B2 | 1/2010 | Suzuki et al. |
| 7,847,576 B2 | 12/2010 | Koiima |
| 8,319,526 B2 | 11/2012 | Jansson |
| 2004/0217793 A1 | 11/2004 | Bertrand et al. |
| 2006/0197570 A1 | 9/2006 | Yang et al. |
| 2008/0218223 A1 | 9/2008 | Kimura |
| 2009/0134914 A1* | 5/2009 | Huang .................... H03K 5/24 327/64 |
| 2010/0118573 A1 | 5/2010 | Saint-Pierre |
| 2011/0050188 A1 | 3/2011 | Wang et al. |
| 2011/0115529 A1 | 5/2011 | Jansson |
| 2011/0221412 A1 | 9/2011 | Li et al. |
| 2011/0227550 A1 | 9/2011 | Walters et al. |
| 2011/0279103 A1* | 11/2011 | Lee ........................ H02M 1/08 323/282 |
| 2013/0215656 A1 | 8/2013 | Wang et al. |

OTHER PUBLICATIONS

TW Application No. 102105238—Taiwanese Office Action, issued Mar. 11, 2015, with Summary of Examiner's Opinions in Office Action (11 pages).

CN Application No. 201310051690.9—Chinese Office Action and Search Report, issued Mar. 11, 2015, with English Translation (16 pages).

CN Application No. 201310051690.9—Chinese Office Action, issued Dec. 12, 2015, with Machine English Translation (16 pages).

\* cited by examiner

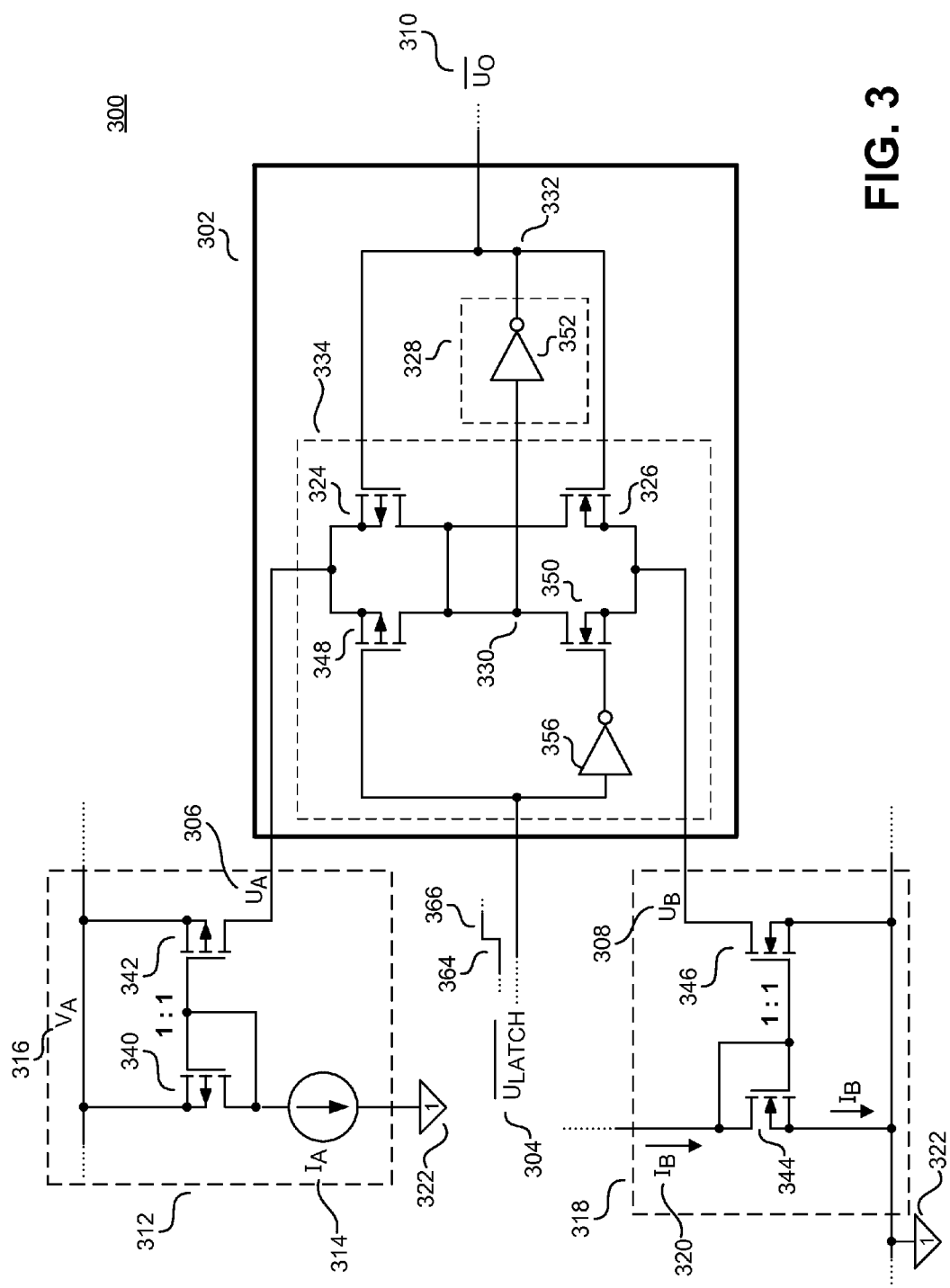

LATCHING COMPARATOR

CROSS-REFERENCE TO RELATED APPLICATIONS

This application is a continuation of U.S. patent application Ser. No. 13/399,741, filed on Feb. 17, 2012, now pending. U.S. patent application Ser. No. 13/399,741 is hereby incorporated by reference.

BACKGROUND INFORMATION

1. Field of the Disclosure

The present invention relates generally to latching comparator circuits. More specifically, embodiments of the present invention are related to latching comparator circuits included in power converters.

2. Background

Electronic devices use power to operate. Switched mode power converters are commonly used due to their high efficiency, small size, and low weight to power many of today's electronics. Conventional wall sockets provide a high voltage alternating current (ac) power. In a switched mode power converter, a high voltage ac input is converted to provide a regulated direct current (dc) output through an energy transfer element. In operation, a switch is utilized to provide the desired output by varying the duty ratio (typically the ratio of the on-time of the switch to the total switching period), varying the switching frequency, or varying the number of pulses per unit time of the switch in a power converter.

The switched mode power converter also includes a controller that typically provides output regulation by sensing and controlling the output in a closed loop. The controller may receive a feedback signal representative of the output and then vary one or more parameters (such as duty ratio, switching frequency, or the number of pulses per unit time of the switch) in response to the feedback signal to regulate the output to a desired quantity.

Design of a switched mode power converter and controller is often a compromise between requirements of efficiency, size, weight, and cost. Further, regulatory requirements limit the amount of energy which power converters can consume when they operate at low loads, such as standby loads and at no load. As such, the amount of power consumed by the controller is also taken into consideration when designing the controller.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3 is a schematic illustrating generally yet another example of a latching comparator in accordance with the teachings of the present invention.

DETAILED DESCRIPTION

Figure 1:
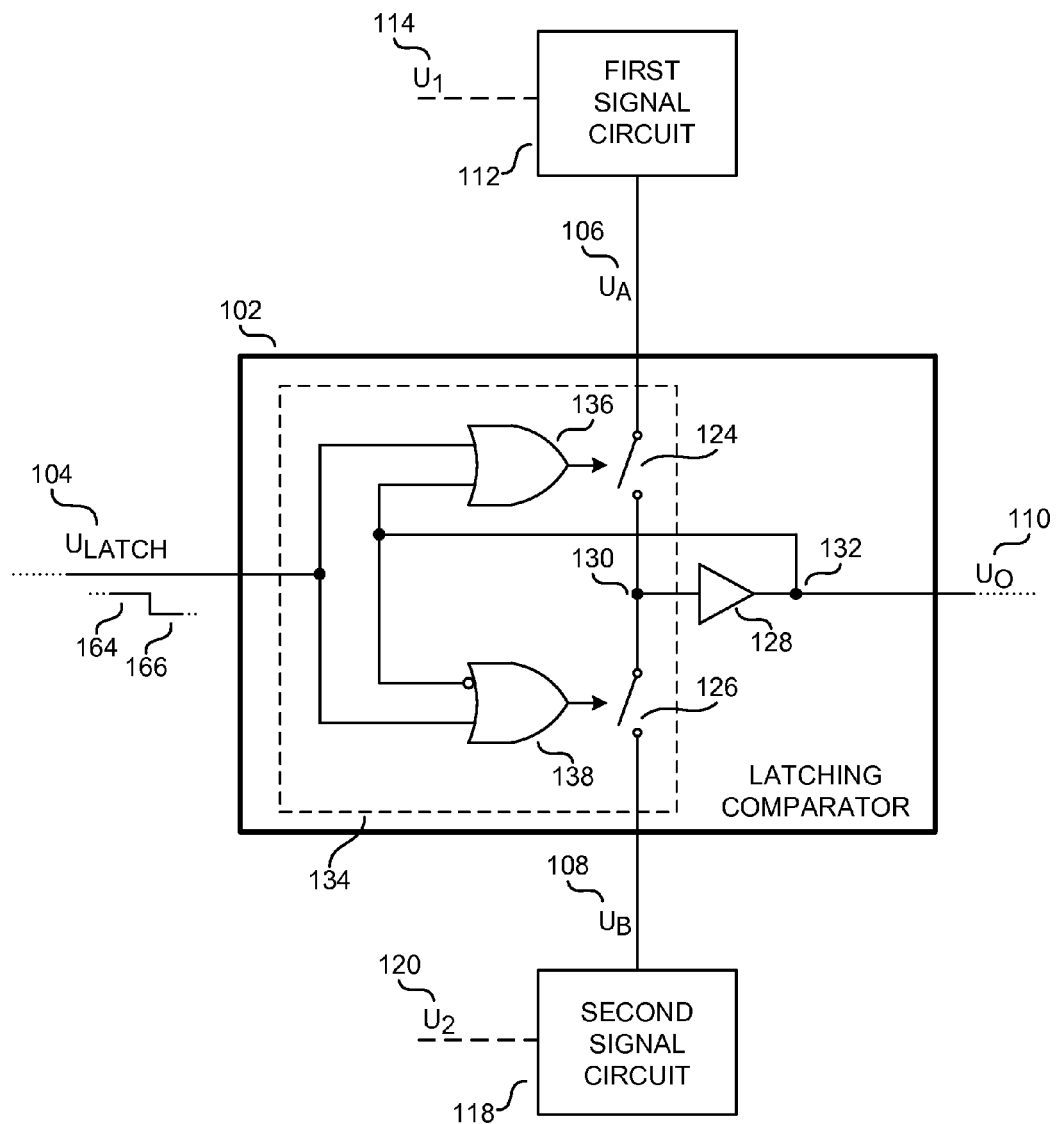
FIG. 1 is a block diagram illustrating generally one example of a latching comparator included in a circuit in accordance with the teachings of the present invention.

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As mentioned above, design of a switched mode power converter and controller is often a compromise between requirements of efficiency, size, weight, and cost. The controller of the power converter may be implemented as an integrated circuit. In general, the overall number of components utilized in the controller increases the total cost of the controller. More components in the controller may also increase the size of the controller which may also contribute to the total cost of the controller.

Regulatory requirements also limit the amount of energy which power converters can consume when they operate at low loads, such as standby loads and at no load. Currently the no load power consumption requirement for a switched mode power converter is approximately 100 milliwatts (mW). As such, the amount of power consumed by the controller is also taken into consideration when designing the controller.

Current comparators may be one component utilized in a controller. In general, a current comparator may comprise two current mirrors whose outputs are coupled together. Depending on which current mirror provided the greater current, the output of the current comparator would either be a logic high or a logic low value. To hold the output of the current comparator, the output of the current comparator is typically provided to a separate latch. In a typical current comparator, current from one of the two current mirrors flows through the current comparator and therefor consuming energy regardless if the output of the current comparator is latched. In addition, the typical latch is comprised of approximately 20 switches which increase the total component count and size of the controller.

As will be shown, a latching comparator, which in one example may be included in a power converter controller, is disclosed. In one example, the disclosed circuit is coupled to receive two signals and then compares two signals during a first state of a latching signal. The result of the comparison is then latched at an output of the latching comparator during a second state of the latching signal. In one example, one of the compared signals is then disconnected from the latching comparator in response to the output of the comparator after the comparison is complete. Thus, in the example, rather than latching the output of the comparator, the input of the comparator is latched in effect by the disconnection of one of the signals at the input of the comparator after the comparison. In one example, the comparing and the latching provided with disclosed circuit are realized with a reduced number of transistors and with reduced power consumption in accordance with the teachings of the present invention.

To illustrate, FIG. 1 shows a general block diagram of an example latching circuit 100 that includes one example of a latching comparator 102 in accordance with the teachings of the present invention. In one example, circuit 100 is a portion of a larger circuit, such as for example a power converter controller in accordance with the teachings of the present invention.

As shown in the example depicted in FIG. 1, latching comparator 102 includes a switching logic circuit 134 coupled to an output circuit 128. In the illustrated example, output circuit 128 is a buffer circuit or a driver circuit, which drives an output at its output terminal 132 that is representative of the input at its input terminal 130. In one example, the input of output circuit 128 is a high impedance input. It is appreciated that output circuit 128 can be implemented with a variety of different circuit configurations, including for example one or more inverters.

In one example, switching logic circuit 134 is coupled to receive a first signal 106 and a second signal 108. In one example, first signal 106 is received from first signal circuit $U_A$ 112 and second signal $U_B$ 108 is received from second signal circuit 118. In one example first signal $U_A$ 106 may be a fixed signal generated by first signal circuit 112, or in another example, first signal $U_A$ 106 may optionally be generated by first signal circuit 112 in response to a first input signal $U_1$ 114. In one example second signal $U_B$ 108 may be a fixed signal generated by second signal circuit 118, or in another example, second signal $U_B$ 108 may optionally be generated by second signal circuit 118 in response to a second input signal $U_2$ 120.

The example shown in FIG. 1 also shows that switching logic circuit 134 is also coupled to receive a latching signal $U_{LATCH}$ 104, which may have a first state 164 or a second state 166. In one example, first state 164 of latching signal $U_{LATCH}$ 104 indicates that switching logic circuit 134 is to compare first signal $U_A$ 106 and second signal $U_B$ 108. In the example, second state 166 indicates that switching logic circuit 134 is to latch the result of the previous comparison of first signal $U_A$ 106 and second signal $U_B$ 108 in accordance with the teachings of the present invention. In one example, latching signal $U_{LATCH}$ 104 is a rectangular pulse waveform with varying lengths of logic high and logic low sections. In examples, the first state 164 may refer to the logic high sections while the second state 166 may refer to the logic low sections, or vice versa.

As will be discussed in further detail below, first signal $U_A$ 106 and second signal $U_B$ 108 in one example are signals that are representative of one or more electrical characteristics of first signal circuit 112 and second signal circuit 118, respectively. For instance, in one example, first signal circuit 112 and second signal circuit 118 include internal current mirror circuits, and first signal $U_A$ 106 and second signal $U_B$ 108 are signals that are representative of the magnitudes of currents of the internal current mirror circuits included in first signal circuit 112 and second signal circuit 118, respectively. In addition, in one example, first signal circuit 112 and second signal circuit 118 may also be internally coupled to different voltage references. Thus, first signal 106 and second signal 108 are signals that may be representative of the different voltage references within first signal circuit 112 and second signal circuit 118, respectively. Therefore, it is appreciated that first signal 106 and second signal 108 may be representative of magnitudes of currents and/or voltages in connection with the respective first signal circuit 112 and second signal circuit 118, respectively, in accordance with the teachings of the present invention.

As shown in the example in the FIG. 1, input terminal 130 of output circuit 128 is coupled to the switching logic circuit 134. In one example, input terminal 130 of output circuit 128 is coupled to receive both first signal $U_A$ 106 and second signal $U_B$ 108 through the switching logic circuit 134 in response to the latching signal $U_{LATCH}$ 104 being in a first state 164. In the example, input terminal 130 of output circuit 128 is coupled to receive only one of the first signal $U_A$ 106 and second signal $U_B$ 108 through the switching logic circuit 134 in response to an output signal $U_O$ 110 representative of output terminal 132 of output circuit 128 and in response to the latching signal $U_{LATCH}$ 104 being in a second state 166.

To illustrate, the example switching logic circuit 134 depicted in FIG. 1 includes a first switch 124 coupled to a second switch 126 as shown. First switch 124 is coupled to receive first signal $U_A$ 106 and second switch 126 is coupled to receive second signal $U_B$ 108. As shown, input terminal 130 of output circuit 128 is coupled between first switch 124 and second switch 126. In addition, switching logic circuit 134 also includes a first logic gate 136 and a second logic gate 138 as shown. In the example, first logic gate 136 is coupled to receive latching signal $U_{LATCH}$ 104 and output signal $U_O$ 110 representative of the output terminal 132 of output circuit 128. Similarly, second logic gate 138 is coupled to receive latching signal $U_{LATCH}$ 104 and output signal $U_O$ 110 representative of the output terminal 132 of output circuit 128. In the example shown in FIG. 1, the circle coupled to the input of second logic gate 138 which is coupled to receive output signal $U_O$ 110 indicates that an inverter is coupled between the second logic gate 138 and output terminal 132 such that the second logic gate 138 receives an inverted output signal $U_O$ 110. First switch 124 is coupled to be switched in response to the first logic gate 136, and second switch 126 is coupled to be switched in response to the second logic gate 138. It is generally understood that a switch that is closed may conduct current and is considered ON, while a switch that is open cannot conduct current and is considered OFF.

In operation, when latching signal $U_{LATCH}$ 104 is in first state 164 (which in one example is a logic high value), both first switch 124 and second switch 126 are ON. As a result, input terminal 130 of output circuit 128 is coupled to receive both first signal $U_A$ 106 and second signal $U_B$ 108 while latching signal $U_{LATCH}$ 104 is in the first state 164. In one example, first signal $U_A$ 106 and second signal $U_B$ 108 are both representative of magnitude of currents. As a result, input terminal 130 functions as a comparator when latching signal $U_{LATCH}$ 104 is in first state 164, which results in input terminal 130 comparing first signal $U_A$ 106 and second signal $U_B$ 108. Thus in one example, if the magnitude of current represented by first signal $U_A$ 106 is greater than the magnitude of current represented by second signal $U_B$ 108, the output terminal 132 of output circuit 128 is pulled to a logic high value. If the magnitude of current represented by second signal $U_B$ 108 is greater than the magnitude of current represented by first signal $U_A$ 106, the output terminal 132 of output circuit 128 is pulled to a logic low value.

In further example, first signal $U_A$ 106 and second signal $U_B$ 108 are both representative of magnitudes of current outputted from current mirrors included in first signal circuit 112 and second signal circuit 118 while latching signal $U_{LATCH}$ 104 is in the first state 164. Thus, in one example, if the magnitude of a current in the internal current mirror of first signal circuit 112 is greater than the magnitude of a current in the internal current mirror of second signal circuit 118, then the output terminal 132 of output circuit 128 is pulled to a high logical value. If the magnitude of the current in the internal current mirror of first signal circuit 112 is less than the magnitude of the current in the internal current mirror of second signal circuit 118, then the output terminal 132 of output circuit 128 is pulled to a low logical value.

Continuing with the example, after latching signal $U_{LATCH}$ 104 transitions from first state 164 to second state 166 (which in one example is switching from a logic high to a logic low value), first logic gate 136 and second logic gate 138 switch first switch 124 and second switch 126, respectively, in response to output signal $U_O$ 110, which is representative of output terminal 132. As discussed above, the output terminal 132 of output circuit 128 is set to a value in response to the comparison of first signal $U_A$ 106 and second signal $U_B$ 108 while latching signal $U_{LATCH}$ 104 was previously in first state 164. Therefore, in one example, if first signal $U_A$ 106 is greater than second signal $U_B$ 108, first logic gate 136 controls the first switch 124 such that the first switch 124 is ON while the second logic gate 138 controls the second switch 126 such that the second switch 126 is OFF when latching signal $U_{LATCH}$ 104 is in second state 166. Similarly, if first signal $U_A$ 106 is less than second signal $U_B$ 108, first logic gate 136 controls the first switch 124 such that the first switch 124 is OFF while the second logic gate 138 controls the second switch 126 such that the second switch 126 is ON when latching signal $U_{LATCH}$ 104 is in second state 166.

Therefore, when latching signal $U_{LATCH}$ 104 is in second state 166, input terminal 130 of the output circuit 128 is coupled to receive only one of first signal $U_A$ 106 and second signal $U_B$ 108 through the switching logic circuit 134 in response to a output signal $U_O$ 110, which is representative of output terminal 132 of the output circuit 128 when latching signal $U_{LATCH}$ 104 is in second state 166 in accordance with the teachings of the present invention. In the example, when latching signal $U_{LATCH}$ 104 is in second state 166, the voltage at input terminal 130 is set to a voltage representative of an internal voltage within either first signal circuit 112 or second signal circuit 118. Thus, in the example, the input of the comparator is latched by the disconnection of either the first signal or the second signal.

Figure 2A:
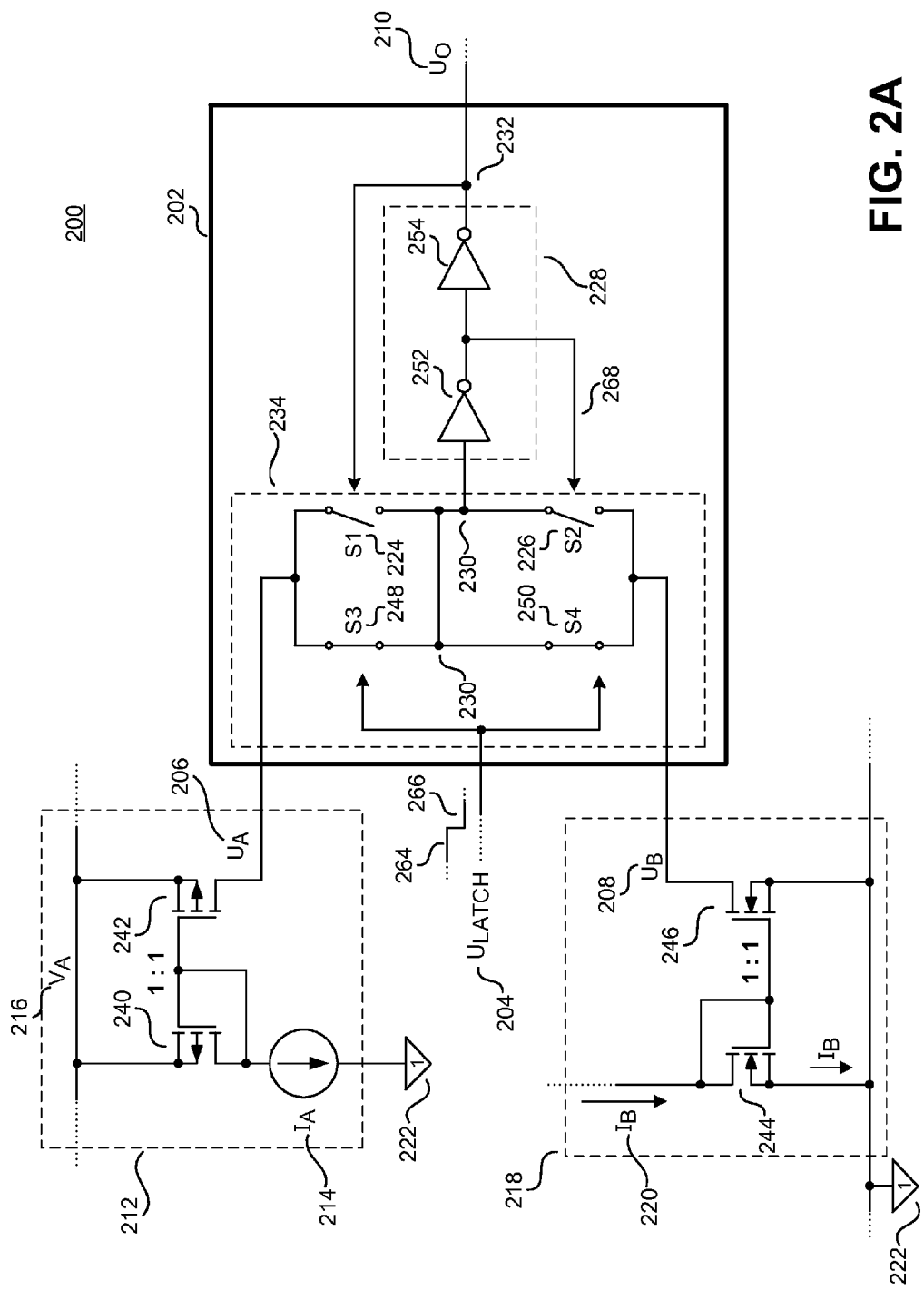
FIG. 2A is a schematic illustrating generally one example of a latching comparator during a first state of a latching signal in accordance with the teachings of the present invention.

FIG. 2A is an example schematic of an example circuit 200 that includes another example of a latching comparator 202 in accordance with the teachings of the present invention. In one example, circuit 200 is a portion of a larger circuit, such as for example a power converter controller in accordance with the teachings of the present invention.

As shown in the example depicted in FIG. 2A, latching comparator 202 includes a switching logic circuit 234 coupled to an output circuit 228. In the illustrated example, output circuit 228 is a buffer circuit or a driver circuit, which drives an output at its output terminal 232 that is representative of the input at its input terminal 230. As shown in the illustrated example, output circuit 228 is implemented with a first inverter 252 and a second inverter 254 coupled between the input terminal 230 and the output terminal 232 of output circuit 228. In the depicted example, the input terminal 230 of output circuit 228 is a high impedance input.

In one example, switching logic circuit 234 is coupled to receive a first signal $U_A$ 206 and a second signal $U_B$ 208. In one example, first signal $U_A$ 206 is received from first signal circuit 212 and second signal $U_B$ 208 is received from second signal circuit 218.

As shown in the illustrated example depicted in FIG. 2A, first signal circuit 212 includes a current mirror having a transistor 240 and a transistor 242 with commonly coupled gates, and coupled to voltage $V_A$ 216. In the specific example shown in FIG. 2A, transistor 240 and transistor 242 are p-channel MOSFETs (PMOS) and have a ratio of 1:1. In the example, first signal $U_A$ 206 is a fixed signal generated from transistor 242 of the current mirror circuit in response to a fixed current source 214 (which provides current $I_A$) coupled to transistor 240 as shown.

As shown in the example of FIG. 2A, second signal circuit 218 includes a current mirror having a transistor 244 and a transistor 246 with commonly coupled gates, and coupled to a ground reference voltage 222. In the specific example shown in FIG. 2A, transistor 244 and transistor 246 are n-channel MOSFETs (NMOS) transistors and have a ratio of 1:1. In the example, second signal $U_B$ 208 is generated from transistor 246 of the current mirror circuit in response to second input signal 220 coupled to transistor 244 as shown. In one example, second input signal 220 is a current $I_B$, which may be generated in response to a flow of current through a programming element such as for example a programming resistor coupled to circuit 200, or the like.

The example shown, FIG. 2A also shows that switching logic circuit 234 is also coupled to receive a latching signal $U_{LATCH}$ 204, which may have a first state 264 or a second state 266. In one example, first state 264 of latching signal 204 indicates that switching logic circuit 234 is to compare first signal $U_A$ 206 and second signal $U_B$ 208. In the example, second state 266 indicates that switching logic circuit 234 is to latch the result of the previous comparison of first signal $U_A$ 206 and second signal $U_B$ 208 in accordance with the teachings of the present invention.

To illustrate, the example switching logic circuit 234 depicted in FIG. 2A includes a first switch 224 coupled to receive first signal $U_A$ 206 and a second switch 226 coupled to receive second signal $U_B$ 208. Input terminal 230 of output circuit 228 is coupled between first switch 224 and second switch 226. In operation, first switch 224 is coupled to be switched in response to an output signal $U_O$ 210 representative of the output terminal 232 of output circuit 228. Similarly, second switch 226 is coupled to be switched in response to an output signal 268 representative of the output terminal 232 of output circuit 228. In the specific example shown in FIG. 2A, output signal 268 is an inverted representation of output terminal 232 of output circuit 228.

In the illustrated example, example switching logic circuit 234 further includes a third switch 248 coupled to receive first signal $U_A$ 206 and a fourth switch 250 coupled to receive second signal $U_B$ 208. Input terminal 230 of output circuit 228 is also coupled between third switch 248 and fourth switch 250 as shown. In operation, third switch 248 and fourth switch 250 are coupled to be switched in response to latching signal $U_{LATCH}$ 204. In one example, both third switch 248 and fourth switch 250 are both coupled to be ON when latching signal 204 is in the first state 264, and are both coupled to be OFF when latching signal 204 is in the second state 266.

Thus, when latching signal 204 is in the first state 264 and both third switch 248 and fourth switch 250 are ON, input terminal 230 of output circuit 228 is coupled to receive both first signal $U_A$ 206 and second signal $U_B$ 208 through third switch 248 and fourth switch 250. In the example, while latching signal $U_{LATCH}$ 204 is in the first state 264, first signal $U_A$ 206 is representative of the magnitude of the current from the current mirror including transistor 240 and transistor 242 of first signal circuit 212. In addition, while latching signal 204 is in the first state 264, second signal $U_B$ 208 is representative of the magnitude of the current from the current mirror including transistor 244 and transistor 246 of second signal circuit 218. Thus, in the example depicted in FIG. 2A, while latching signal $U_{LATCH}$ 204 is in the first state 264, first signal $U_A$ 206 is representative of the magnitude of the current corresponding to fixed current source 214, which is illustrated as current $I_A$ and second signal $U_B$ 208 is representative of the magnitude of the current corresponding to the second input signal 220, which is illustrated as current $I_B$.

Continuing with the specific example shown in FIG. 2A, while latching signal $U_{LATCH}$ 204 is in the first state 264 (in one example, the latching signal $U_{LATCH}$ 204 is logic high), input terminal 230 functions as a comparator, which results in input terminal 230 comparing first signal $U_A$ 206 and second signal $U_B$ 208. Thus, in the illustrated example, if the magnitude of the current in fixed current source 214 is greater than the magnitude of the current of second input signal 220 (in other words, the magnitude of current $I_A$ is greater than the magnitude of current $I_B$), then input terminal 230 of output circuit is pulled towards voltage $V_A$ 216 and the output terminal 232 of output circuit 228 is pulled to a logic high value. If the magnitude of the current in fixed current source 214 is less than the magnitude of the current of second input signal 220 (in other words, the magnitude of current $I_A$ is less than the magnitude of current $I_B$), then input terminal 230 of output circuit is pulled towards ground reference voltage 222 and the output terminal 232 of output circuit 228 is pulled to a logic low value.

As a result of the output terminal 232 of output circuit 228 being pulled to either the logic high or a logic low value as discussed above while latching signal $U_{LATCH}$ 204 is in the first state 264, both output signal 210 and output signal 268, which are representative of output terminal 232, are correspondingly pulled to logic high or logic low levels, which will control first switch 224 and second switch 226 accordingly.

Figure 2B:
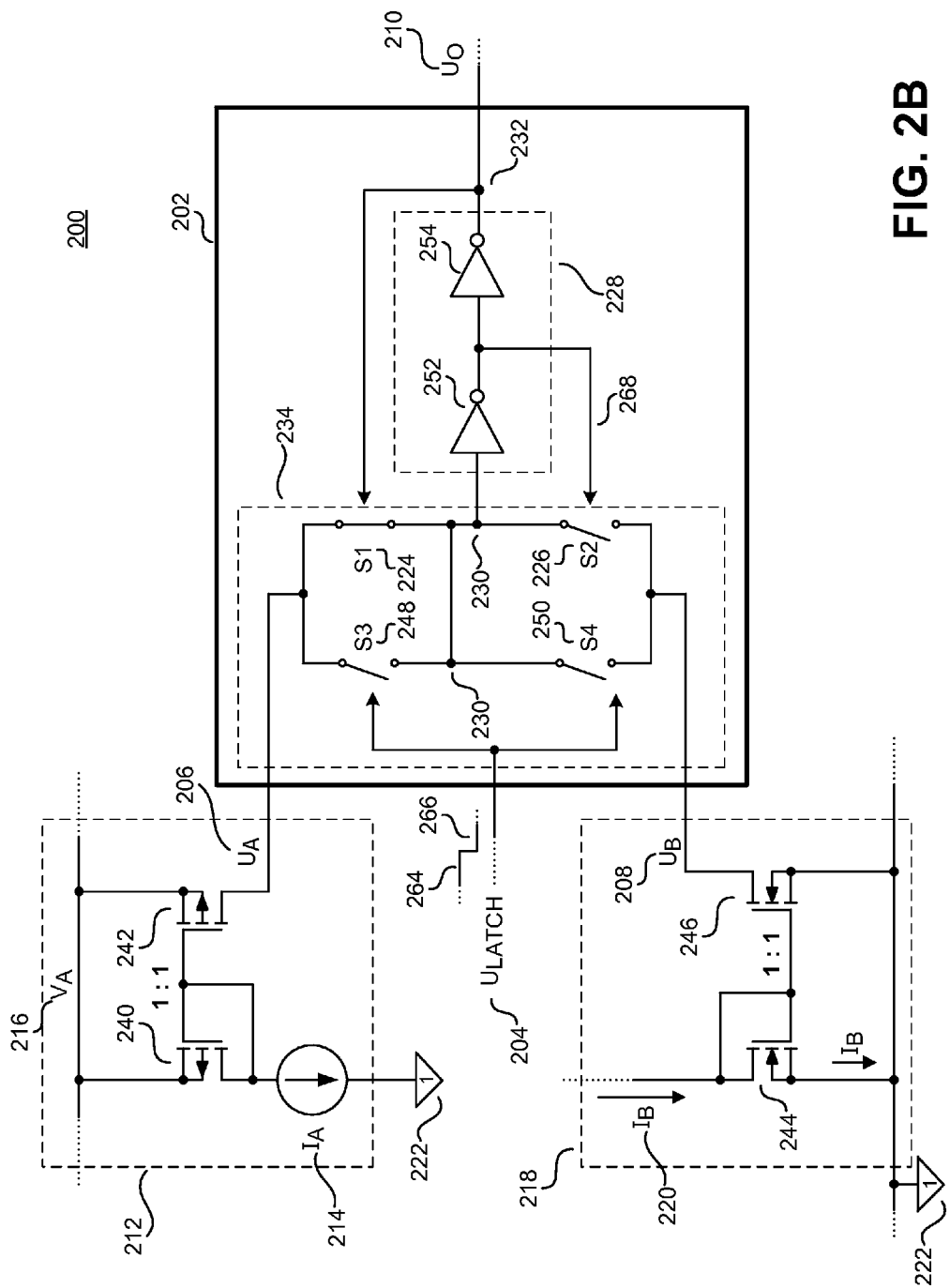
FIG. 2B is a schematic illustrating generally one example of a latching comparator during a second state of a latching signal in accordance with the teachings of the present invention.

To illustrate, FIG. 2B shows the example latching comparator 202 of circuit 200 of FIG. 2A in which first signal $U_A$ 206 was greater than second signal $U_B$ 208 while latching signal $U_{LATCH}$ 204 was previously in the first state 264, which resulted in first switch 224 being ON in response to output signal 210, and in second switch 226 being OFF in response to output signal 268. In the example shown in FIG. 2B, latching signal $U_{LATCH}$ 204 has now transitioned to the second state 266 (in one example, the latching signal $U_{LATCH}$ 204 is logic low), which results in third switch 248 and fourth switch 250 also being switched OFF.

Continuing with the example depicted in FIG. 2B, with first switch 224 switched ON and with second switch 226, third switch 248 and fourth switch 250 all switched OFF, the voltage at input terminal 230 is coupled to a logical high voltage (e.g., voltage $V_A$ 216) through first switch 224 from first signal circuit 212. With the input terminal 230 of output circuit 228 now coupled to a logic high value, output signal 210 and output signal 268, which are representative of output terminal 232 of output circuit 228 remain latched at their respective settings while latching signal $U_{LATCH}$ 204 remains in second state 266. In addition, since the input terminal 230 of output circuit 228 is a high impedance input terminal, it is noted that there is substantially no current flowing through switching logic circuit 234 and output circuit 228 of latching comparator 202 when latching signal 204 remains in the second state 266, in accordance with the teachings of the present invention. As such, the latching comparator 202 consumes little to no energy once latched.

Figure 2C:
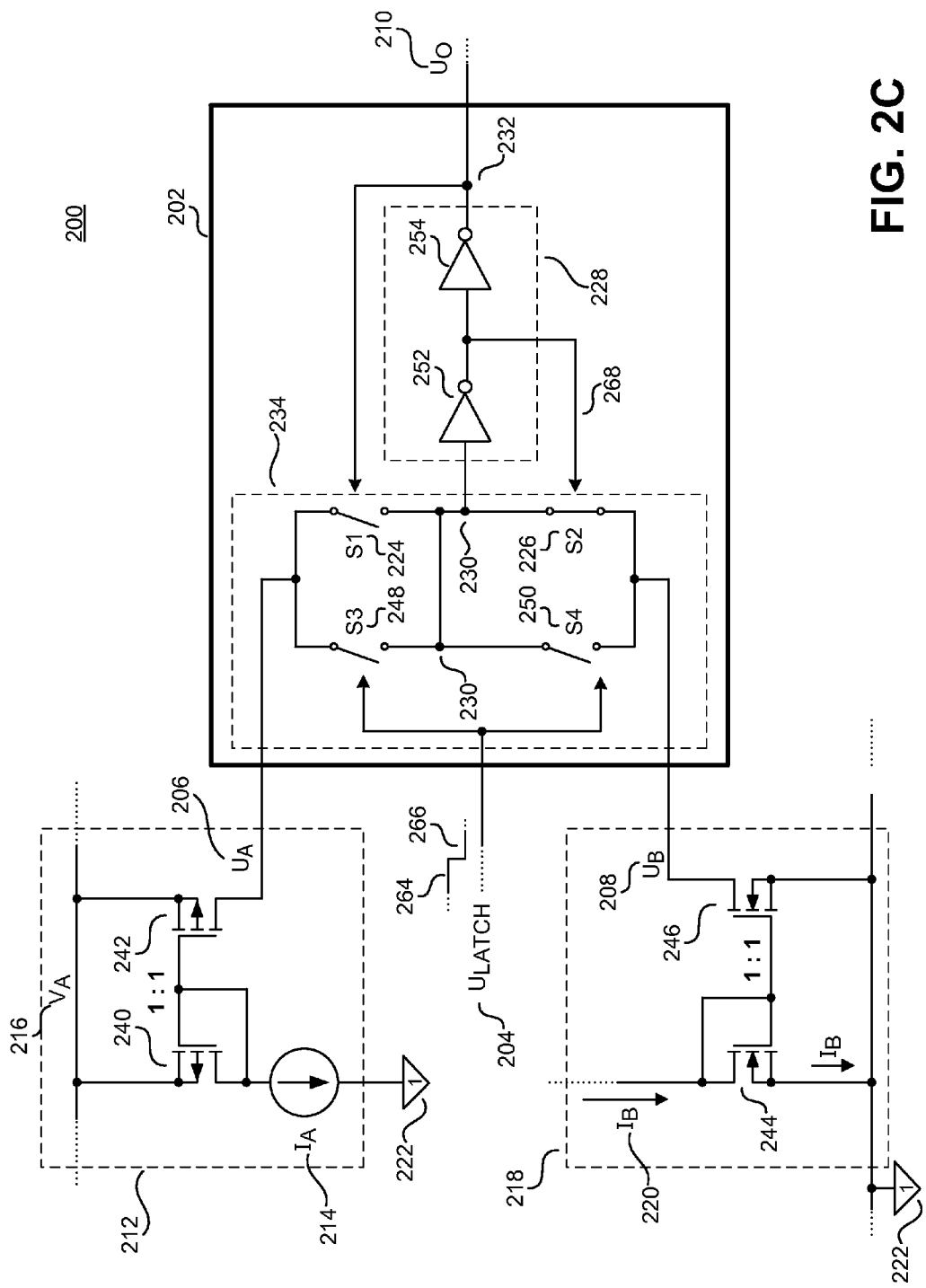
FIG. 2C is a schematic illustrating generally another example of a latching comparator during a second state of a latching signal in accordance with the teachings of the present invention.

FIG. 2C shows the example latching comparator 202 of circuit 200 of FIG. 2A in which first signal $U_A$ 206 was less than second signal $U_B$ 208 while latching signal $U_{LATCH}$ 204 was previously in the first state 264, which resulted in first switch 224 being OFF in response to output signal 210, and in second switch 226 being ON in response to output signal 268. In the example shown in FIG. 2C, latching signal 204 has now transitioned to the second state 266, which results in third switch 248 and fourth switch 250 also being switched OFF.

Continuing with the example depicted in FIG. 2C, with second switch 226 switched ON and with first switch 224, third switch 248 and fourth switch 250 all switched OFF, the voltage at input terminal 230 is now coupled to a logical low voltage (e.g., ground reference voltage 222) through second switch 226 from second signal circuit 218. With the input terminal 230 of output circuit 228 now coupled to a logic low value, output signal 210 and output signal 268, which are representative of output terminal 232 of output circuit 228 remain latched at their respective settings while latching signal 204 remains in second state 266. In addition, since the input terminal 230 of output circuit 228 is a high impedance input terminal, it is noted that there is substantially no current flowing through switching logic circuit 234 and output circuit 228 of latching comparator 202 when latching signal 204 remains in the second state 266 in accordance with the teachings of the present invention.

FIG. 3 is an example schematic of an example circuit 300 that includes yet another example of a latching comparator 302 in accordance with the teachings of the present invention. As can be appreciated, example circuit 300 and example latching comparator 302 share many similarities with the circuit 200 and example latching comparator 202 examples discussed above in connection with FIGS. 2A, 2B and 2C.

For instance, in one example, circuit 300 is a portion of a larger circuit, such as for example a power converter controller in accordance with the teachings of the present invention. In the depicted example, latching comparator 302 includes a switching logic circuit 334 coupled to an output circuit 328. In the illustrated example, output circuit 328 drives an output at its output terminal 332 that is representative of the input at its input terminal 330. As shown in the illustrated example, output circuit 328 is implemented with an inverter 352 coupled between the input terminal 330 and the output terminal 332 of output circuit 328. In particular, the output signal 310 is an inverted representation of the signal at the input terminal 330. In the depicted example, the input terminal 330 of output circuit 328 is a high impedance input.

In the example, switching logic circuit 334 of latching comparator 302 is coupled to receive a first signal $U_A$ 306 from a first signal circuit 312, and a second signal $U_B$ 308 from a second signal circuit 318. As shown in the example, first signal circuit 312 includes a current mirror circuit having a transistor 340 and a transistor 342 with commonly coupled gates, and coupled to voltage $V_A$ 316. In the example, first signal $U_A$ 306 is a fixed signal generated from transistor 342 in response to a fixed current source 314 (with current $I_A$)

coupled to transistor 340 as shown. Second signal circuit 318 includes a current mirror circuit having a transistor 344 and a transistor 346 with commonly coupled gates, and coupled to a ground reference voltage 322. In the example, second signal $U_B$ 308 is generated from transistor 346 of the current mirror circuit in response to second input signal 320 (with current $I_B$) coupled to transistor 344 as shown.

In the example depicted in FIG. 3, switching logic circuit 334 is also coupled to receive a latching signal 304, which has a first state 364 or a second state 366. It is noted that latching signal 304 of FIG. 3 is the inverse of latching signal 204 of FIGS. 2A, 2B, and 2C. For instance, first state 364 of FIG. 3 is represented with a logic low value, while first state 264 of FIGS. 2A, 2B and 2C is represented with a logic high value. Similarly, second state 366 of FIG. 3 is represented with a logic high value, while second state 266 of FIGS. 2A-2C is represented with a logic low value.

In the example, first state 364 of latching signal 304 indicates that switching logic circuit 334 is to compare first signal $U_A$ 306 and second signal $U_B$ 308. In the example, second state 366 indicates that switching logic circuit 334 is to latch the result of the previous comparison of first signal $U_A$ 306 and second signal $U_B$ 308 in accordance with the teachings of the present invention.

To illustrate, the example switching logic circuit 334 depicted in FIG. 3 includes a first switch 324 coupled to receive first signal $U_A$ 306 and a second switch 326 coupled to receive second signal $U_B$ 308. Input terminal 330 of output circuit 328 is coupled between first switch 324 and second switch 326. In operation, first switch 324 is coupled to be switched in response to an output signal 310 representative of the output terminal 332 of output circuit 328. Similarly, second switch 326 is also coupled to be switched in response to output signal 310 representative of the output terminal 332 of output circuit 328. It is noted that in the specific example shown in FIG. 3, first switch 324 is implemented with a p-channel MOSFET while second switch 326 is implemented with an n-channel MOSFET. Therefore, in the example depicted in FIG. 3, when first switch 324 is ON in response to output signal 310, second switch 326 is OFF. Similarly, when first switch 324 is OFF in response to output signal 310, second switch 326 is ON.

In the illustrated example, example switching logic circuit 334 further includes a third switch 348 coupled to receive first signal $U_A$ 306 and a fourth switch 350 coupled to receive second signal $U_B$ 308. Input terminal 330 of output circuit 328 is also coupled between third switch 348 and fourth switch 350 as shown. In operation, third switch 348 and fourth switch 350 are coupled to be switched in response to latching signal 304. It is noted that in the specific example shown in FIG. 3, third switch 348 is implemented with a p-channel MOSFET while fourth switch 350 is implemented with an n-channel MOSFET. However, the gate of fourth switch 350 is also coupled to receive latching signal 304 though an inverter 356 as shown. Therefore, in the illustrated example, both third switch 348 and fourth switch 350 are both coupled to be ON when latching signal 304 is in the first state 364, and are both coupled to be OFF when latching signal 304 is in the second state 366.

Thus, when latching signal 304 is in the first state 364 and both third switch 348 and fourth switch 350 are therefore ON, input terminal 330 of output circuit 328 is coupled to receive both first signal $U_A$ 306 and second signal $U_B$ 308 through third switch 348 and fourth switch 350. In the example, while latching signal 304 is in the first state 364, first signal $U_A$ 306 is representative of the magnitude of the current from the current mirror circuit of first signal circuit 212, which is illustrated as the current $I_A$ of fixed current source 314 coupled to transistor 340 in the example of FIG. 3. In addition, while latching signal 304 is in the first state 364, second signal $U_B$ 308 is representative of the magnitude of the current from the current mirror circuit of second signal circuit 318, which is illustrated as the current $I_B$ of second input signal 320 coupled to transistor 344 in the example of FIG. 3.

Continuing with the specific example shown in FIG. 3, while latching signal 304 is in the first state 364, input terminal 330 functions as a comparator, which results in input terminal 330 comparing first signal $U_A$ 306 and second signal $U_B$ 308. Thus, in the illustrated example, if the magnitude of the current in fixed current source 314 is greater than the magnitude of the current of second input signal 320, then input terminal 330 of output circuit is pulled towards voltage $V_A$ 316 and the output terminal 332 of output circuit 328 is pulled to a logic low value through inverter 352. If the magnitude of the current in fixed current source 314 is less than the magnitude of the current of second input signal 320, then input terminal 330 of output circuit is pulled towards ground reference voltage 322 and the output terminal 332 of output circuit 328 is pulled to a logic high value through inverter 352.

As a result of the output terminal 332 of output circuit 328 being pulled to either the logic high or logic low value while latching signal 304 is in the first state 364, output signal 310, which is representative of output terminal 332, is correspondingly pulled to the logic high or logic low value. In response one of first switch 324 and second switch 326 is ON, and the other one of first switch 324 and second switch 326 is OFF.

Continuing with the example, when latching signal 304 transitions from first state 364 to second state 366, both third switch 348 and fourth switch 350 will be switched OFF. Thus, in an example when first switch 324 is switched ON, and second switch 326, third switch 348 and fourth switch 350 are all switched OFF, the voltage at input terminal 330 is coupled to a logical high voltage (e.g., voltage $V_A$ 316) through first switch 324 from first signal circuit 312. With the input terminal 330 of output circuit 328 set to a logical high voltage, output signal 310, which is representative of output terminal 332 of output circuit 328 remains latched at a logic low value through inverter 352 while latching signal 304 remains in second state 366. In addition, since the input terminal 330 of output circuit 328 is a high impedance input terminal, it is noted that there is substantially no current flowing through switching logic circuit 334 and output circuit 328 of latching comparator 302 when latching signal 304 remains in the second state 366 in accordance with the teachings of the present invention.

Similarly, in an example when second switch 326 is switched ON, and first switch 324, third switch 348 and fourth switch 350 are all switched OFF, the voltage at input terminal 330 is coupled to a logical low voltage (e.g., ground reference voltage 322) through second switch 326 from second signal circuit 318. With the input terminal 330 of output circuit 328 set to a logical low voltage, output signal 310, which is representative of output terminal 332 of output circuit 328 remains latched at a logic high value through inverter 352 while latching signal 304 remains in second state 366. In addition, since the input terminal 330 of output circuit 328 is a high impedance input terminal, it is noted that there is substantially no current flowing through switching logic circuit 334 and output circuit 328 of latching comparator 302 when latching signal 304 remains in the second state 366 in accordance with the teachings of the present invention.

Figure 4:
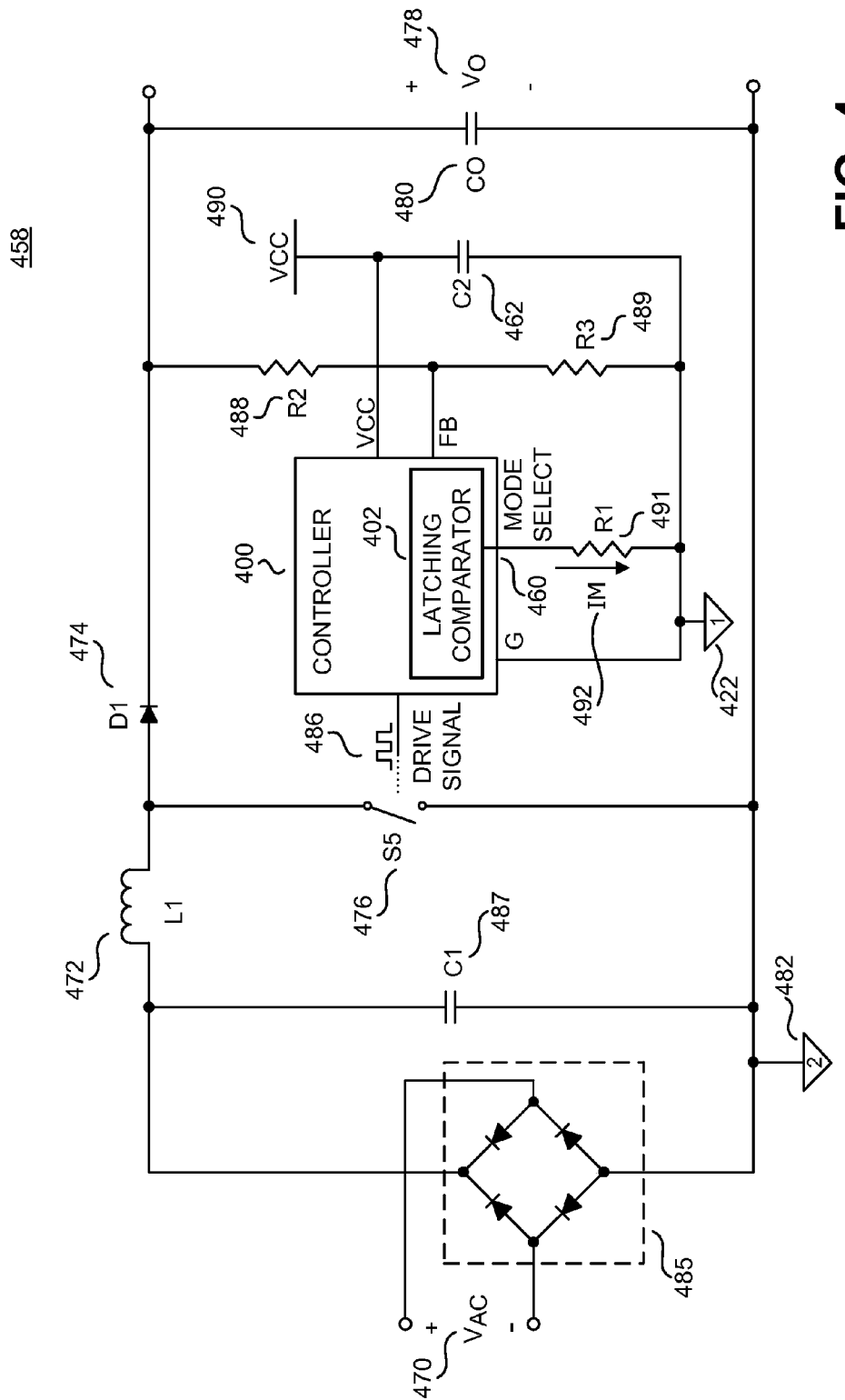
FIG. 4 is a schematic illustrating generally an example power converter having a controller including one example of a latching comparator for selecting a mode of operation of the controller in accordance with the teachings of the present invention.

FIG. 4 is an example schematic of a power converter 458 including controller 400, which utilizes an example latching comparator 402 in accordance with the teachings of the present invention. As shown in the depicted example, power converter 458 as a boost converter. It is appreciated of course that the example power converter 458 is only provided as an example and that other circuits and/or other power supply topologies may include circuitry including a latching comparator in accordance with the teachings of the present invention.

Continuing with the example depicted in FIG. 4, power converter 458 includes an energy transfer element 472 coupled to receive an input voltage VAC from input 470 through rectifier 485. A power switch 476 is coupled to energy transfer element 472. In one example, input voltage VAC is an ac signal that is rectified with rectifier 485 and is filtered with a capacitor 487 coupled to input return 482 and across rectifier 485 as shown. An output diode D1 474 coupled to energy transfer element 472 rectifies the energy delivered from energy transfer element 472 to the load capacitor 480 coupled to the output 478. The output voltage $V_O$ across load capacitor 480 at output 478 is divided with a resistor divider including resistor R2 488 and resistor R3 489 to provide a feedback signal representative of output 478 to the FB terminal of controller 400. A voltage VCC is provided across capacitor 462 to controller 400 at a VCC terminal of controller 400. In operation, power switch 476 is switched in response to a drive signal 486, which is generated by controller 400 in response to the feedback signal to control the transfer of energy from the input 470 to the output 478 of the power converter 458.

In the example illustrated in FIG. 4, controller 400 may be programmable to operate in a plurality of different modes of operation. For instance, in one example, controller 400 may be programmed to have a normal mode of operation or an alternate low power mode of operation. It is appreciated of course that the normal mode operation and low power mode of operation mentioned above for controller 400 are provided for explanation purposes and that other suitable modes of operation or operating characteristics may be programmed for controller 400 utilizing latching comparator 402 in accordance with the teachings of the present invention.

In one example, a mode of operation may be selected or programmed for controller 400 by selecting a resistance value for a resistor R1 491 that is coupled between a mode select terminal 460 of controller 400 and a ground reference voltage 422 as shown. In another example, resistor R1 491 may be coupled between mode select terminal 460 and a different voltage terminal, such as for example voltage VCC 490. In the example, a resulting programming current IM 492 is generated through resistor 491, which is coupled to mode select terminal 460.

In one example, the programming current 492 may be utilized as an input signal to a latching comparator 402 integrated within controller 400 to latch a selected programming mode of operation for controller 400 in accordance with the teachings of the present invention. For instance, in one example, if the programming current 492 is greater than a threshold value, then one mode of operation may be selected and latched by latching comparator 402 of controller 400 in accordance with the teachings of the present invention. On the other hand, if the programming current 492 is less than the threshold value, then another mode of operation may be selected and latched by latching comparator 402 of controller 400 in accordance with the teachings of the present invention.

Figure 5:
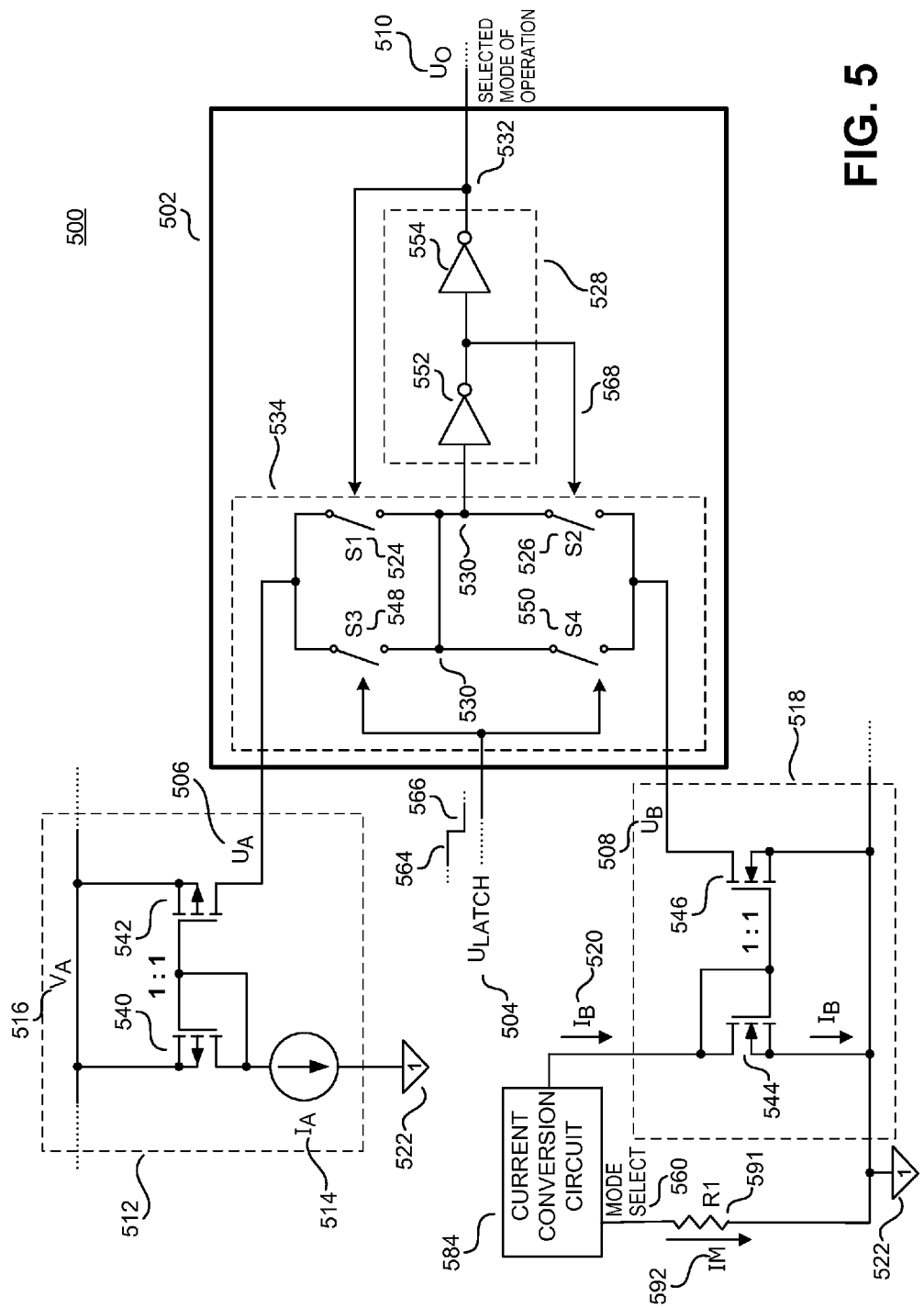
FIG. 5 is a schematic illustrating generally an example of a latching comparator utilized in a controller of a power converter to select a mode of operation of the controller in accordance with the teachings of the present invention.

To illustrate, FIG. 5 shows an example schematic of a circuit 500, which in one example is a portion of controller 400 of FIG. 4. It is appreciated that other portions of controller 400 are not shown in detail so as not to obscure the teachings of the present invention. It is noted that circuit 500 of FIG. 5 shares many similarities with circuit 200 of FIGS. 2A, 2B, and 2C. In particular, similar to circuit 200 of FIGS. 2A, 2B, and 2C, circuit 500 also includes an example latching comparator 502 coupled to receive a latching signal 504, a first signal $U_A$ 506 from a first signal circuit 512, and a second signal $U_B$ 508 from a second signal circuit 518. In one example, it is appreciated that the function and operation of the corresponding circuit components of FIGS. 2A, 2B, and 2C and 5 are similar.

However, one difference between circuit 500 of FIG. 5 and circuit 200 of FIGS. 2A, 2B, and 2C is the inclusion of a current conversion circuit 584 in circuit 500, which in one example generates a second input signal 520 (with current $I_B$) for second signal circuit 518. In the example, a resistor 591 is coupled to a mode select terminal 560 coupled to current conversion circuit 584, through which a programming current 592 flows. In the example, it is appreciated that mode select terminal 560, resistor 591 and programming current 592 of FIG. 5 correspond with mode select terminal 460, resistor 491 and programming current 492 of FIG. 4. In addition, it is appreciated that the current $I_A$ of fixed current source 514 corresponds with the threshold value discussed above with respect to FIG. 4.

Therefore, in one example, the resistance value of resistor 591 of FIG. 5 may be chosen to select a magnitude for the programming current IM 592 through mode select terminal 560 to ground reference voltage 522. Current conversion circuit 584 then generates second input signal 520, which is also illustrated as current $I_B$ in FIG. 5, in response to programming current 592. The current mirror circuit provided with transistor 544 and transistor 546 generates second signal $U_B$ 508, which is coupled to be received by latching comparator 502. Latching comparator 502 also receives first signal $U_A$ 506, which in one example corresponds to the threshold value discussed above with respect to FIG. 4.

Therefore, in one example, latching signal 504 is in the first state 564 when the controller of circuit 500 is programmed. When latching signal 504 is in first state 564, first signal $U_A$ 506 (e.g., the threshold value) is compared with second signal $U_B$ 508 (e.g., the programming current IM 592) at input terminal 530 of the output circuit 528. If first signal $U_A$ 506 is greater than second signal $U_B$ 508, then one programming mode of operation is selected. If first signal $U_A$ 506 is less than second signal $U_B$ 508, then another programming mode of operation is selected.

As discussed above, the result of this comparison is then latched at the output terminal 532 when latching signal 504 transitions from the first state 564 to the second state 566. In the example, the result of the comparison, and therefore the selected mode of operation is indicated with output signal 510, which is representative of the output terminal 532 in accordance with the teachings of the present invention.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A latching comparator, comprising:
   a switching logic circuit coupled to receive a first signal from a first signal circuit, and a second signal from a second signal circuit, wherein the switching logic circuit is further coupled to receive a latching signal that is a rectangular pulse waveform in either a first or a second state; and
   an output circuit having an input terminal coupled to the switching logic circuit, wherein the input terminal of the output circuit is coupled to receive both the first and second signals to compare the first signal and second signal when the latching signal is in the first state, and wherein the input terminal of the output circuit is coupled to receive only one of the first and second signals when the latching signal is in the second state.

2. The latching comparator of claim 1 wherein the first and second signals are representative of magnitudes of currents during the first state of the latching signal.

3. The latching comparator of claim 1 wherein the output circuit comprises a buffer circuit.

4. The latching comparator of claim 1 wherein the output circuit comprises one or more inverters.

5. The latching comparator of claim 1 wherein the switching logic circuit comprises:
   first and second switches coupled to receive the first and second signals, respectively, wherein the input terminal of the output circuit is coupled between the first and second switches; and
   first and second logic gates coupled to receive the latching signal and a signal representative of an output terminal of the output circuit, wherein the first switch is coupled to be switched in response to the first logic gate, and wherein the second switch is coupled to be switched in response to the second logic gate.

6. The latching comparator of claim 1 wherein said only one of the first and second signals is representative of a voltage during the second state of the latching signal.

7. The latching comparator of claim 1 wherein the switching logic comprises:
   first and second switches coupled to receive the first and second signals, respectively, wherein the input terminal of the output circuit is coupled between the first and second switches, wherein the first and second switches are coupled to be switched in response to a signal representative of the output terminal of the output circuit; and
   third and fourth switches coupled to receive the first and second signals, respectively, wherein the input terminal of the output circuit is coupled between the third and fourth switches, wherein the third and fourth switches are coupled to be switched in response to the latching signal.

8. The latching comparator of claim 1 wherein a signal representative the output terminal of the output circuit is representative of a selected mode of operation of a controller for use in a power converter.

9. A power converter, comprising:
   an energy transfer element coupled between an input of the power converter and an output of the power converter;
   a power switch coupled to energy transfer element; and
   a controller coupled to generate a drive signal to switch the power switch to control a transfer of energy from the input of the power converter to an output of the power converter, the controller including a latching comparator coupled to a mode select terminal coupled to receive a mode select signal to select a mode of operation of the controller, the latching comparator including:
      a switching logic circuit coupled to receive a latching signal, a first signal, and a second signal, wherein the latching signal is a rectangular pulse waveform in either a first or a second state, wherein the second state is representative of the mode select signal; and
      an output circuit having an input terminal coupled to the switching logic circuit, wherein the input terminal of the output circuit is coupled to receive both the first signal and second signal when the latching signal is in the first state, and wherein the input terminal of the output circuit is coupled to receive only one of the first signal and the second signal when the latching signal is in the second state.

10. The power converter of claim 9 wherein the first and second signals are representative of magnitudes of currents during the first state of the latching signal.

11. The power converter of claim 9 wherein said only one of the first and second signals is representative of a voltage during the second state of the latching signal.

12. The power converter of claim 9 wherein the controller further comprises a current conversion circuit coupled to generate the second input signal in response to the mode select signal coupled to be received through the mode select terminal of the controller.

13. The power converter of claim 9 wherein the output circuit comprises a buffer circuit.

14. The power converter of claim 9 wherein the output circuit comprises one or more inverters.

15. The power converter of claim 9 wherein the switching logic circuit comprises:
   first and second switches coupled to receive the first and second signals, respectively, wherein the input terminal of the output circuit is coupled between the first and second switches; and
   first and second logic gates coupled to receive the latching signal and a signal representative of an output terminal of the output circuit, wherein the first switch is coupled to be switched in response to the first logic gate, and wherein the second switch is coupled to be switched in response to the second logic gate.

16. The power converter of claim 9 wherein the switching logic comprises:
   first and second switches coupled to receive the first and second signals, respectively, wherein the input terminal of the output circuit is coupled between the first and second switches, wherein the first and second switches are coupled to be switched in response to a signal representative of the output terminal of the output circuit; and
   third and fourth switches coupled to receive the first and second signals, respectively, wherein the input terminal of the output circuit is coupled between the third and fourth switches, wherein the third and fourth switches are coupled to be switched in response to the latching signal.

* * * * *